(12) United States Patent
Sancon

(10) Patent No.: US 11,837,286 B2
(45) Date of Patent: *Dec. 5, 2023

(54) ELECTRICAL DISTANCE-BASED WAVE SHAPING FOR A MEMORY DEVICE

(71) Applicant: Micron Technology, Inc., Boise, ID (US)

(72) Inventor: John Christopher Sancon, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/046,393

(22) Filed: Oct. 13, 2022

(65) Prior Publication Data

US 2023/0111770 A1    Apr. 13, 2023

Related U.S. Application Data

(63) Continuation of application No. 17/328,809, filed on May 24, 2021, now Pat. No. 11,488,663, which is a
(Continued)

(51) Int. Cl.
*G11C 11/00* (2006.01)
*G11C 13/00* (2006.01)

(52) U.S. Cl.
CPC ........ *G11C 13/003* (2013.01); *G11C 13/0026* (2013.01); *G11C 13/0028* (2013.01); *G11C 13/0004* (2013.01); *G11C 13/0011* (2013.01)

(58) Field of Classification Search
CPC ............. G11C 13/003; G11C 13/0026; G11C 13/0028; G11C 13/0004
(Continued)

(56) References Cited

U.S. PATENT DOCUMENTS 7,532,518 B2    5/2009    Yang et al.
9,343,156 B1    5/2016    Mui et al.
(Continued)

FOREIGN PATENT DOCUMENTS

KR    10-2020-0061253 A    6/2020
TW    200905682 A    2/2009
TW    202015047 A    4/2020

OTHER PUBLICATIONS

International Search Report and Written Opinion for PCT Application No. PCT/US2021/034318 dated Sep. 10, 2021 (9 pages).
(Continued)

*Primary Examiner* — Vu A Le
(74) *Attorney, Agent, or Firm* — Fletcher Yoder, P.C.

(57) ABSTRACT

Memory devices have an array of elements in two or more dimensions. The memory devices use multiple access lines arranged in a grid to access the memory devices. Memory cells are located at intersections of the access lines in the grid. Drivers are used for each access line and configured to transmit a corresponding signal to respective memory cells of the plurality of memory cells via a corresponding access line. The memory devices also include compensation circuitry configured to determine which driving access lines driving a target memory cell of the plurality of memory cells has the most distance between the target memory cell and a respective driver. The plurality of access lines comprise the driving access lines. The compensation circuitry also is configured to output compensation values to adjust the voltages of the driving access lines based on a polarity of the voltage of the longer driving access line.

26 Claims, 9 Drawing Sheets

Related U.S. Application Data continuation-in-part of application No. 16/903,921, filed on Jun. 17, 2020, now Pat. No. 11,170,851.

(58) Field of Classification Search
USPC .......................................................... 365/148
See application file for complete search history.

(56) References Cited

U.S. PATENT DOCUMENTS

| | | |
|---|---|---|
| 2006/0152965 A1 | 7/2006 | Nautiyal et al. |
| 2007/0058425 A1 | 3/2007 | Cho et al. |
| 2008/0239813 A1 | 10/2008 | Sekar et al. |
| 2009/0285047 A1* | 11/2009 | Brown .................... G11C 8/10 365/230.06 |
| 2012/0134213 A1 | 5/2012 | Choi et al. |
| 2014/0043917 A1 | 2/2014 | Kaneko et al. |
| 2016/0056172 A1 | 2/2016 | Shim et al. |
| 2018/0040371 A1 | 2/2018 | Kim |
| 2020/0020397 A1 | 1/2020 | Lai et al. |
| 2020/0168273 A1 | 5/2020 | Kim et al. |

OTHER PUBLICATIONS

TW office Action for TW Application No. 110122050 dated Dec. 27, 2021, 7 Pages.

* cited by examiner

ELECTRICAL DISTANCE-BASED WAVE SHAPING FOR A MEMORY DEVICE

CROSS REFERENCE TO RELATED APPLICATIONS

This application is a continuation of U.S. application Ser. No. 17/328,809, filed May 24, 2021, entitled "ELECTRICAL DISTANCE-BASED WAVE SHAPING FOR A MEMORY DEVICE," which is a continuation-in-part of U.S. application Ser. No. 16/903,921, entitled "ELECTRICAL DISTANCE-BASED WAVE SHAPING FOR A MEMORY DEVICE," filed Jun. 17, 2020, now U.S. Pat. No. 11,170,851, each of which is hereby incorporated by reference in its entirety for all purposes.

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some of the memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, wordlines and bitlines are used to transmit selection signals to respective memory cells. The selection signals may include signals characterized by voltage levels used to save data into or retrieve data from the memory cells. The wordlines and bitlines may couple to selection signal sources through drivers. The memory cells may be organized into one or more layers of memory cells, such as layers defined between overlapping wordlines and bitlines. These layers may be referred to as decks (e.g., memory decks). Various combinations of the wordlines, bitlines, and/or decoders may be referenced for use in a particular memory operation using addresses (e.g., memory addresses). The address may indicate which memory cell is to be selected using a combination of signals from the wordlines, bitlines, and/or decoders, and a particular value of the address may be based on ranges of addresses of the memory device. As may be appreciated, some memory cells at some intersections of the wordlines and bitlines may be farther from drivers than other memory cells at other intersections. Due to the different electrical properties of paths between the different intersections and drivers, the memory cells may react differently. For instance, near memory cells to the drivers may wear more quickly than far memory cells.

Furthermore, some cells with the same electrical distance may have be different distances from respective bitline and wordline drivers. For instance, a first cell may be close to its bitline driver and far from its wordline driver while a second cell may be moderately close to its bitline and wordline drivers. However, the relative far distances from one driver (e.g., the bitline or the wordline driver) may be more susceptible to current leaks than cells moderately close to both drivers.

BRIEF DESCRIPTION OF THE DRAWINGS

Various aspects of this disclosure may better be understood upon reading the following detailed description and upon reference to the drawings in which.

DETAILED DESCRIPTION

Figure 1:
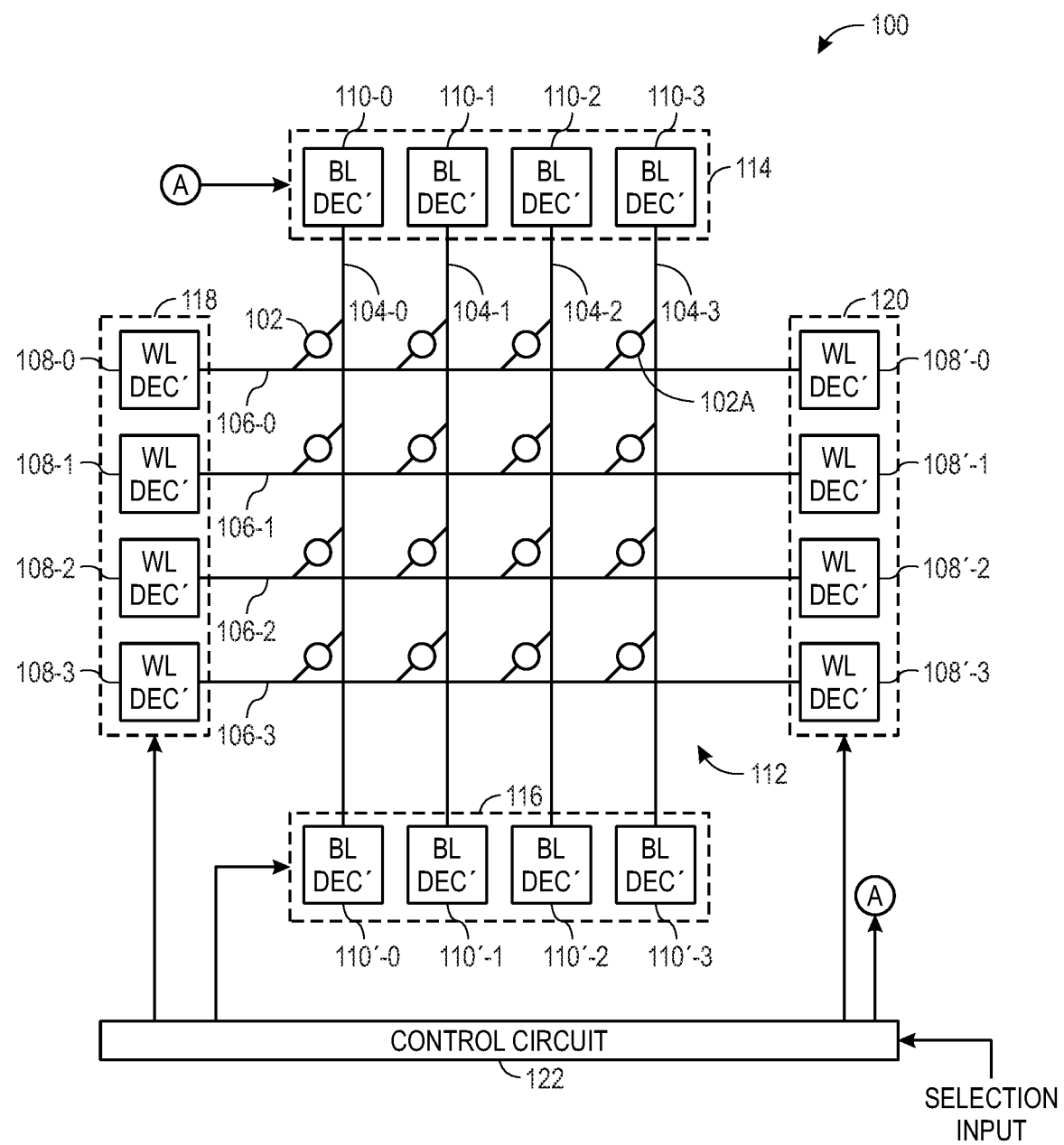
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bitline and a wordline. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell.

In some memories, memory cells of the array may be organized into decks of memory cells. A deck of memory cells may be a single plane of memory cells disposed between a layer of wordlines and a layer of bitlines. The array may be a stack of decks that includes any number of decks of memory cells (e.g., 0 decks, 1 deck, 2 decks, 4 decks, any number of decks) as different layers of the array.

Within a deck, a two-dimensional array of memory cells may be arranged at different intersections of the wordlines and the bitlines in the plane. Some of the intersections may be relatively close to the wordline drivers and/or the bitline drivers while others of the intersections may be relatively far from the wordline drivers and/or the bitline drivers. The transmission lines between the drivers and the intersections may differ. For example, the differences may be related to parasitic capacitances in the transmission lines and/or resistances in the transmission lines. These different lengths and electrical parameters are referred to herein as an electrical distance (ED). Due to the difference in transmission lines between the close intersections and the far intersections, the different intersections may receive voltage and/or current transmissions from the drivers at different levels and/or with different waveshapes. These differences in voltage/current or waveshapes at the different intersections may cause the close memory cells to undergo more stress with rapid current/voltage changes to which the far memory cells may not be subject. Accordingly, the close memory cells may wear more quickly than the far memory cells.

To compensate for such uneven wear and/or response, the memory device may wave shape the transmitted current and/or voltage based at least in part on an electrical distance of an intersection corresponding to a memory cell being accessed. By modulating the wave shape based on the ED, the close intersections and the far intersections may receive signals that are approximately the same shape causing the memory cells at the respective intersections to behave similarly and/or wear evenly. A drive modulator may be used to control the waveshape of the transmitted current and/or voltage. For example, the drive modulator may modulate a control signal applied to a gate of a transistor that controls the waveshape of the transmitted current and/or voltage. The drive modulator may be implemented using a resistor-capacitor (RC) filter to apply a low-pass filtration to smooth a square pulse to a more gradual slope. The capacitor of the RC filter may be variable and set with a capacitance configured to filter the control signals to more strongly filter signals sent to near intersections. Alternatively, the drive modulator may be implemented using a current mirror having a different number of legs based on the ED of the respective memory cell being accessed.

As previously noted, even cells having the same ED as each other may receive different driven voltages due to different leakage currents due to different distances from different drivers even though the overall ED is the same from each of the cells. Specifically, a first cell may be moderately close to both its bitline and wordline drivers while a second cell having the same ED as the first cell may be close to one driver (e.g., bitline or wordline driver) and far from the other driver. The path across the farther distance may be more susceptible to voltage differences at the cell due to subthreshold leakage at cells between the driver and the target cell. This leakage is more pronounced for higher voltages. To mitigate such leakage, cells with a far distance from a driver may have voltage biases adjusted by adjusting both drivers by the same direction and magnitude to maintain the voltage difference across the intersection at the target cell while also lessening the risks of current leakage on the connection from the far driver for the target cell.

Keeping the foregoing introduction in mind, FIG. 1 is a block diagram of a portion of a memory device 100. The memory device 100 may be any suitable form of memory, such as non-volatile memory (e.g., a cross-point memory) and/or volatile memory. The memory device 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell 102.

The bitline decoders 110 may be organized in multiple groups of decoders. For example, the memory device 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104) when selecting a target memory cell 102A from the memory cells 102. For example, bitline decoder 110-4 may operate in conjunction with bitline decoder 110'-4 and/or with wordline decoders 108-0, 108'-0 to select the memory cell 102A. As may be appreciated herein, decoder circuitry on either ends of the wordlines 106 and/or bitlines 104 may be different.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. It is noted that the depicted components of the memory device 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

The memory device 100 may also include a control circuit 122. The control circuit 122 may communicatively couple to respective of the wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on one or more of the bitlines 104 and/or wordlines 106, respectively, to a target of the memory cells 102. In some embodiments, the decoder circuits may provide electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target of the memory cells 102 such that the control circuit 122 is able to access data storage of the target memory cell, such as to read from or write to the data storage. After a target of the memory cells 102 is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage, or may be "reset" to have a second threshold voltage. A set memory cell may have a lower threshold voltage than a reset memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity to the memory cells 102 (e.g., in particular, writing to selector device (SD) material of the memory cell) and reading the memory cells 102 (e.g., in particular, reading a voltage stored by the SD material of the memory cell) using a signal with a given (e.g., known) fixed polarity.

Figure 2:
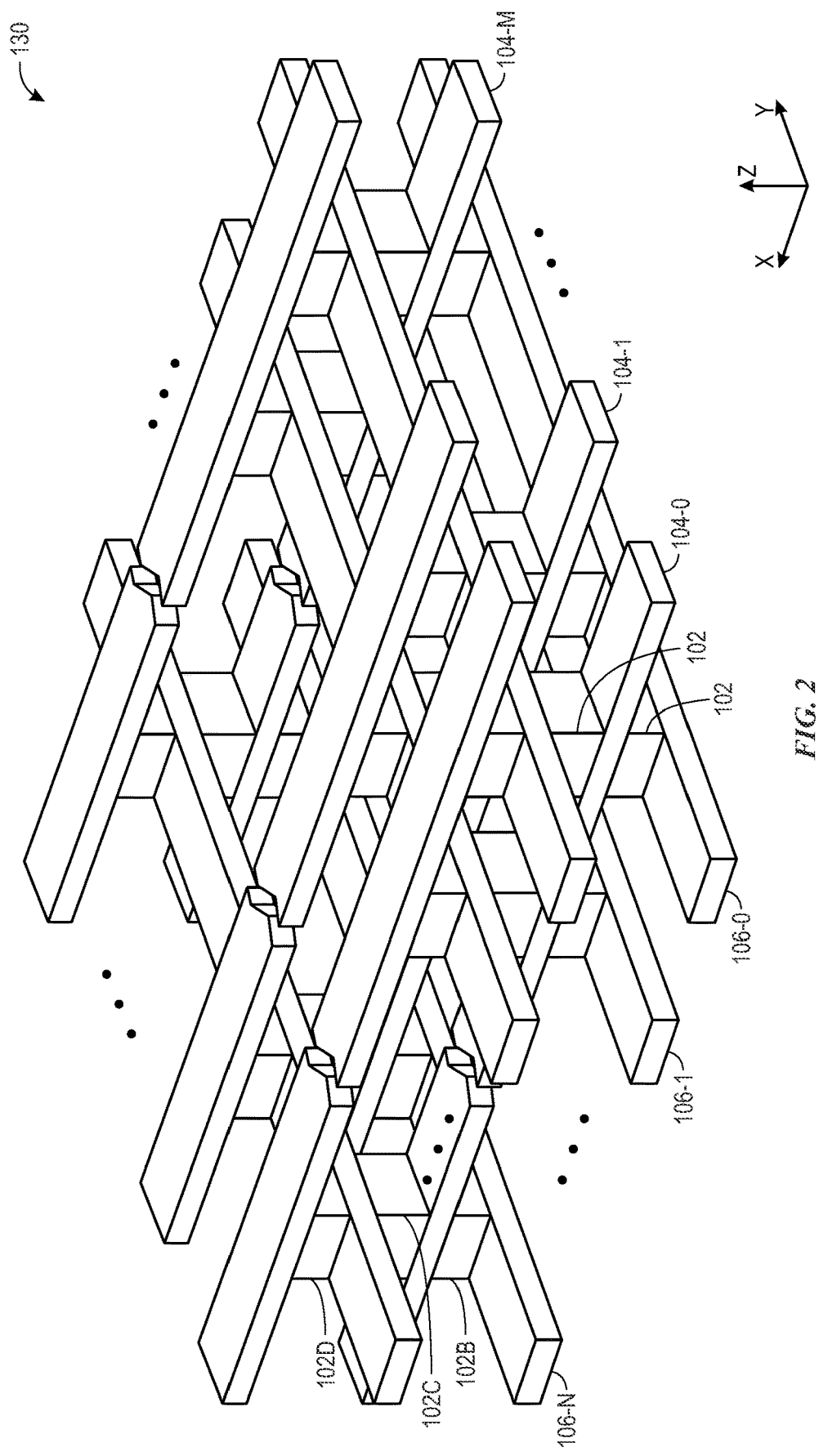
FIG. 2 is a side-view of a diagram illustrating the portion of the memory array of FIG. 2, according to an embodiment of the present disclosure.

FIG. 2 is a diagram illustrating a portion of a memory array 130 in accordance with an embodiment of the present disclosure. The memory array 130 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular of the wordlines 106 and the bitlines 104 serving as the electrodes for a particular of the memory cells 102).

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a selector device (SD) material) and/or a material layer that functionally replaces a separate memory element layer and selector element layer. The selector element (e.g., SD material) may be disposed between a wordline contact (e.g., a layer interface between a respective one of the wordlines 106 and the memory material) and a bitline contact (e.g., a layer interface between a respective one of the bitlines 104 and the selector element) associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104 corresponding to the respective memory cells 102 in response to a particular voltage applied to the selected of the wordlines 106 forming the respective memory cells 102.

As illustrated, the memory array 130 may be arranged in a cross-point memory array architecture (e.g., a three-dimensional (3D) cross-point memory array architecture) that extends in any direction (e.g., x-axis, y-axis, z-axis). The multi-deck cross-point memory array 130 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 130 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 130 may include more or less bitlines 104, wordlines 106, and/or memory cells 102 than shown in the examples of FIG. 2. Each deck may include one or more memory cells 102 aligned in a same plane.

Figure 3:
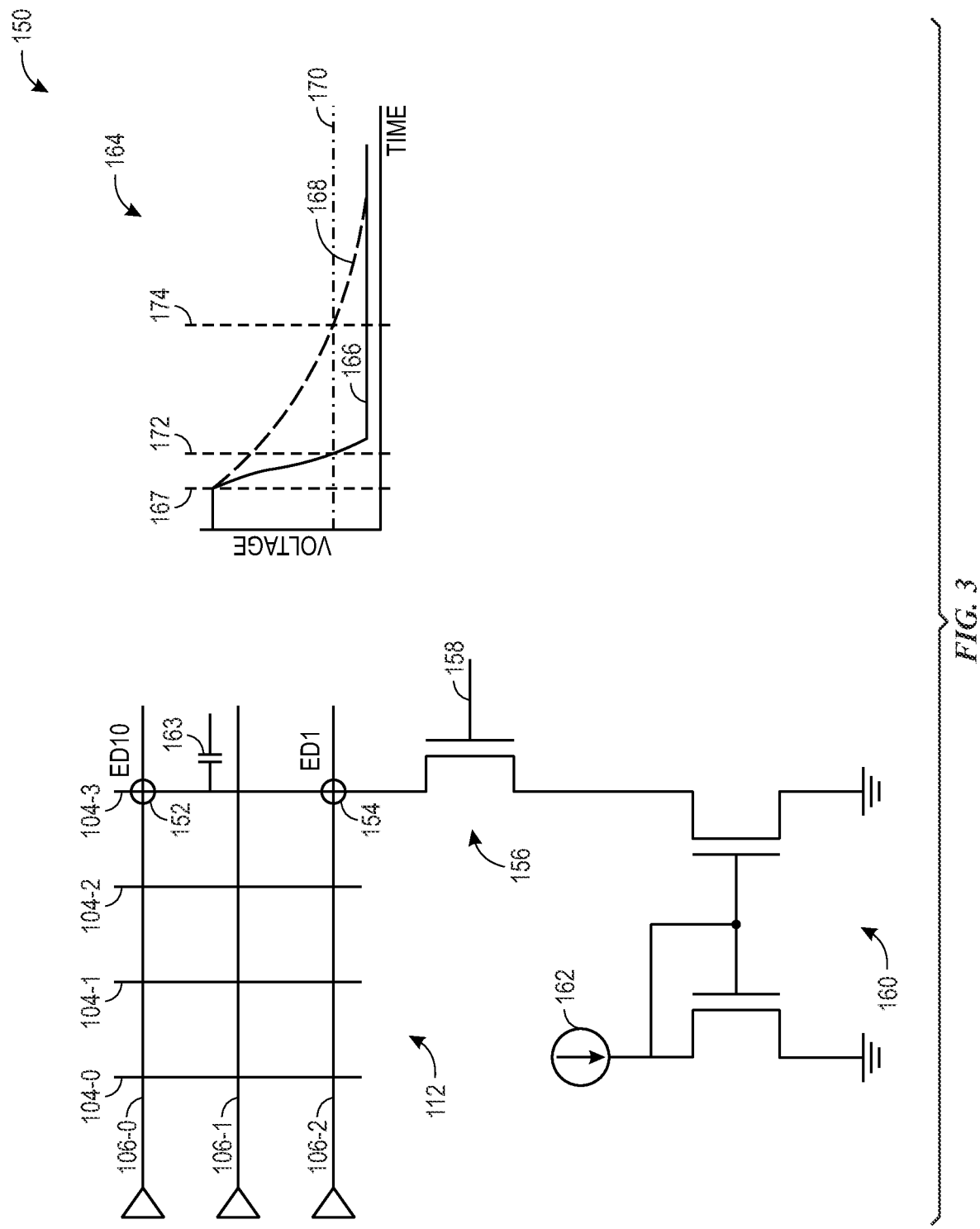
FIG. 3 is a circuit diagram of the memory device of FIG. 1, according to an embodiment of the present disclosure.

FIG. 3 is a simplified diagram of a deck of a memory device 150 that may be an embodiment of the memory device 100. As previously discussed, at the intersections of the bitlines 104 and the wordlines 106 in the memory array 112, the memory cells 102 may be used to store information. However, the memory cells 102 have been omitted from FIG. 3 for simplicity. A selected bitline 104-3 may be used to read and/or write data at intersections 152 and 154. A local driver 156 may supply a signal to the intersections 152 and 154 via the selected bitline 104-3. The local driver 156 may be used to gate a voltage to the intersections 152 and 154. The local driver 156 performs gating using a control signal 158 that is driven by the control circuit 122. The voltage provided to the intersections 152 and 154 are provided using current supplied via a current mirror 160 from a current supply 162.

As may be appreciated, the memory array 112 may include parasitic capacitance represented by a capacitor 163. Based at least in part on the parasitic capacitance and/or resistance in the memory array 112, different intersections have a different electrical distance (ED) that causes different voltages to be seen at different cells. In other words, a voltage seen at the intersection 152 may differ from a voltage seen at the intersection 154. For instance, a graph 164 plots voltage changes over time. For instance, the graph 164 shows an example of a voltage 166 that may occur at the intersection 154. As illustrated, the voltage 166 has a relatively high slope after time 167. The graph 164 also shows a voltage 168 that may occur at the intersection 152. The voltage 168 has a relatively low slope after the time 167. Thus, using a threshold 170, the intersection 154 (e.g., the corresponding memory cell 102) snaps at an earlier time 172 than the intersection 152 at a later time 174. Based on the snapping and rapid change in voltage over a short period of time, the intersection 154 may receive a higher current that, without mitigation, may cause the corresponding memory cell 102 to degrade more quickly than a memory cell at the intersection 152.

Figure 4:
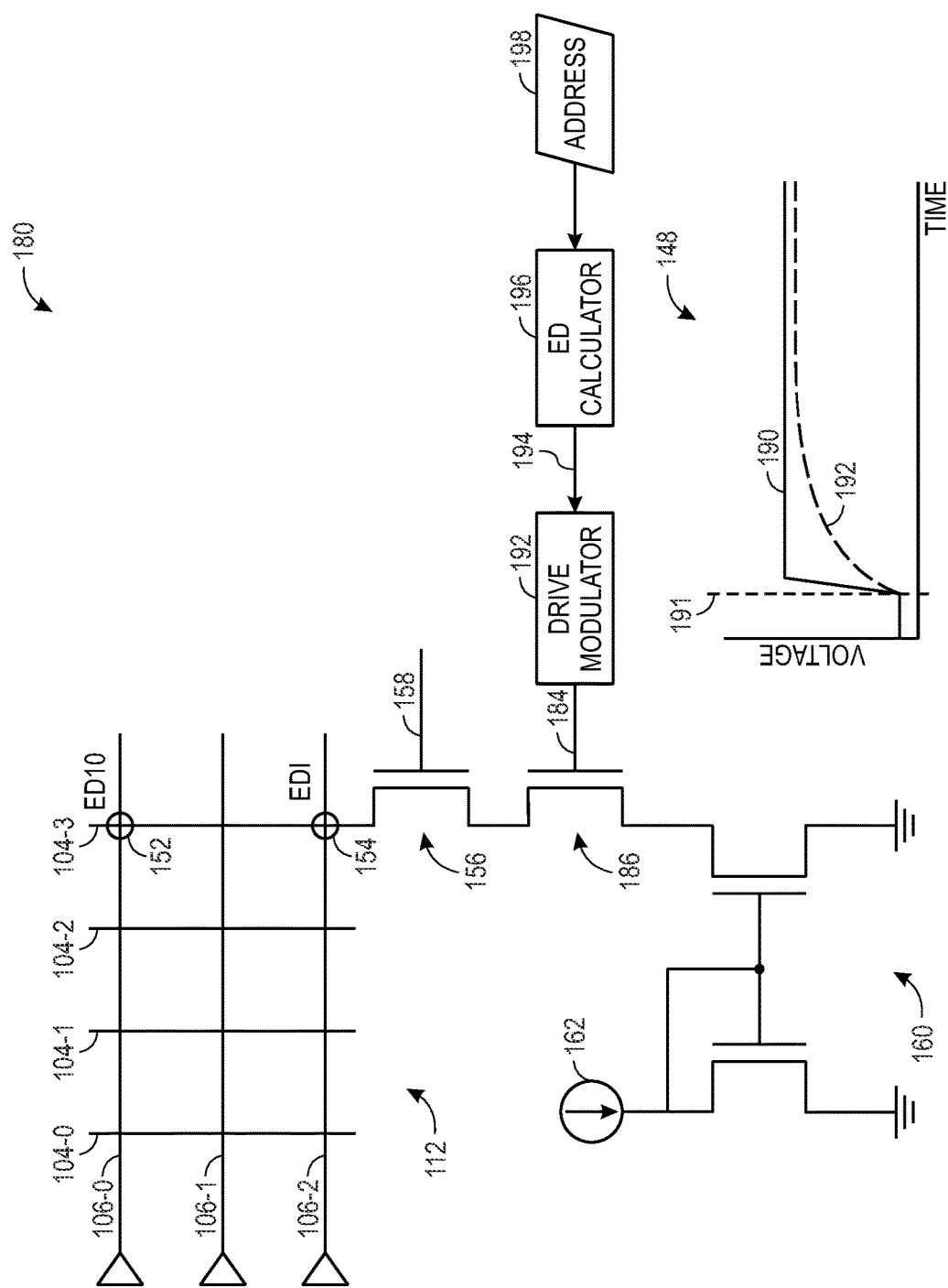
FIG. 4 is a circuit diagram of the memory device of FIG. 1 having a drive modulator, according to an embodiment of the present disclosure.

To mitigate for the quicker snapping at the intersection 154, the memory device 100 may modulate the driving of the intersections to cause the intersections 152 and 154 to be driven similarly with similar currents and/or voltages. For instance, FIG. 4 illustrates a diagram of a deck of a memory device 180 that utilizes a drive modulator 182 to modulate the voltage and/or current on the bitline 104-3. The drive modulator 182 modulates the voltage and/or current on the bitline 104-3 by modifying a control signal 184 applied to a gate of a transistor 186.

The control signal 184 causes the transistor 186 to transmit the voltage and/or current from the current mirror 160 differently to different memory cells 102 based on the ED between the memory cell 102 and the local driver 156. Graph 148 illustrates a graph of voltage over time of a signal transmitted from the transistor 186 to the memory array 112. As illustrated, a first voltage 190 that has a steep slope after time 191. The voltage 190 may be used for a memory cell 102 at the intersection 152 or any other intersections with an ED above a threshold distance. The steep slope of the voltage 190 may be used to drive the far intersections (e.g., intersection 152) due to the gradual change in the corresponding voltage 168. A different voltage or voltages may be used for closer intersections (e.g., intersection 154) to compensate for the quicker slope of the voltage 166. For example, a voltage 192 with a more gradual slope than the voltage 190 may be used to drive the intersection 154. By reducing the slope of the change of the voltage 190 in driving the closer intersections, the voltage received at the closer intersections may more closely emulate the voltage 168.

In some embodiments, more than two different voltages may be used for different intersections. For instance, each intersection may have a corresponding voltage slope. Additionally or alternatively, each ED may have a corresponding voltage slope to be used to drive corresponding intersections with the ED. In other words, the drive modulator may have two or more voltage slopes used to drive two or more intersections with corresponding memory cells to cause each of the voltages at each of the intersections to approximate the voltage 168. Thus, the different voltages may be used to compensate for differences in electrical properties from the local driver 156 to the different intersections of the memory array 112 in a bitline 104 and/or wordline 106. Therefore, using the bitline 104-3 as an example, the different transmitted voltages cause arriving voltages at the intersection 152 and 154 to both approximate the voltage 168 regardless of the parasitic capacitances and/or resistances of the bitline 104-3. The same compensation principles may be applied to any other intersection of bitlines 104 and wordlines 106 based on the electrical distance from drivers of the bitlines 104 and/or the wordlines 106.

The drive modulator 182 may modify the control signal 184 based at least in part on an electrical distance (ED) indicator 194 that is output from an ED calculator 196 that calculates an ED of a respective intersection based at least in part on an address 198 of the respective intersection. The address 198 may be provided from the control circuit 122 when a corresponding memory cell 102 is accessed. The ED calculator 196 may include a lookup table (LUT) that is used to store an ED for the different intersections. In certain embodiments, the drive modulator 182 and/or the ED calculator 196 may be included in the control circuit 122.

Figure 5:
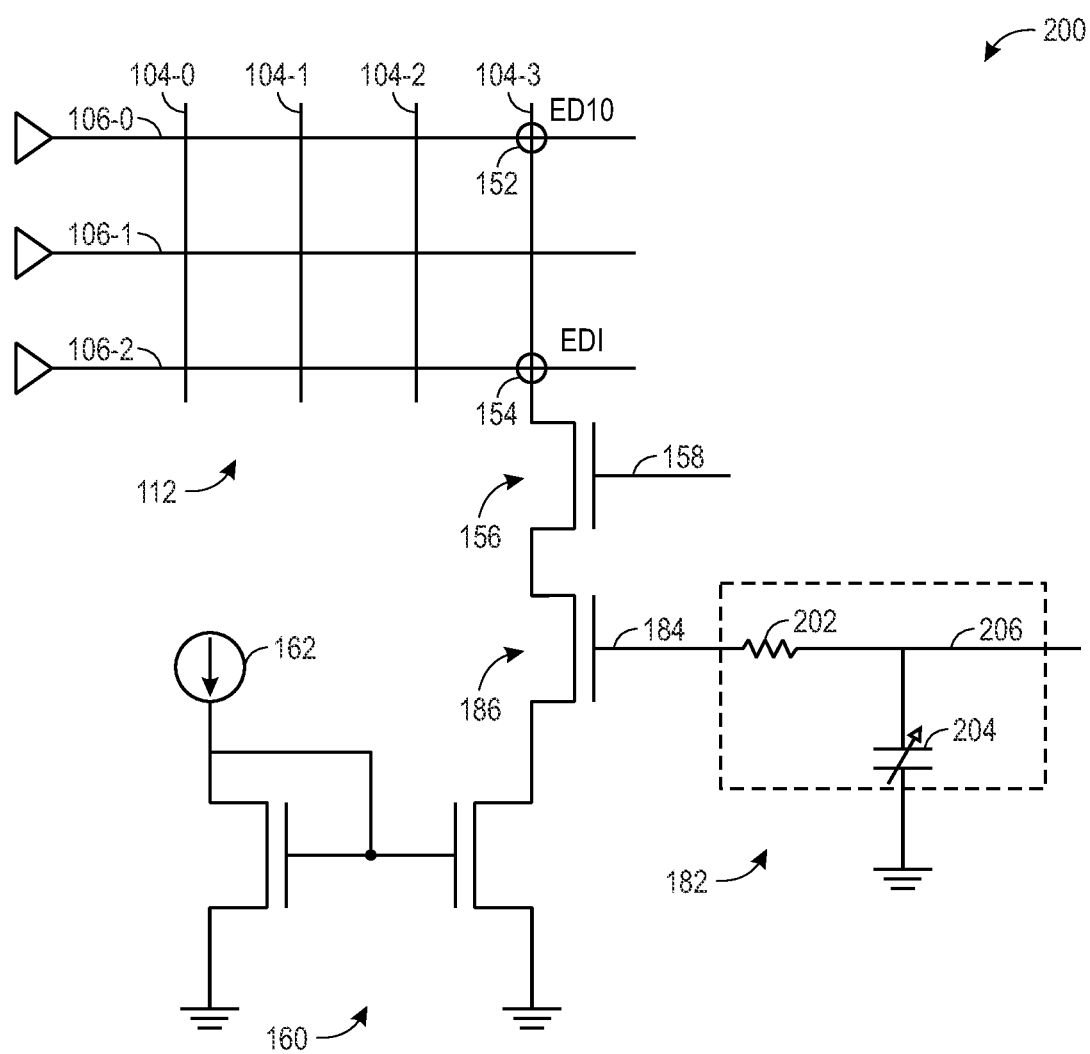
FIG. 5 is a circuit diagram of the memory device of FIG. 4 with the drive modulator implemented using a resistor-capacitor (RC) filter, according to an embodiment of the present disclosure.

FIG. 5 is a schematic diagram of a deck of a memory device 200 that may be an embodiment of the memory device 150 and/or 100. In the memory device 200, the drive modulator 182 is implemented using a resistor-capacitor (RC) filter. The RC filter includes a resistor 202 and a variable capacitor 204. The RC filter may be arranged to perform as a low pass filter (LFP). The LPF may be used to smooth a pulse from a square wave to a wave with a smaller slope. The amount of filtration applied to the control signal 158 may vary with the amount of capacitance set for the variable capacitor 204. The amount of capacitance applied to a signal 206 is varied by the ED of a respective intersection. For instance, the control circuit 122 may set the capacitance to a relatively high value for the intersection 154 to transmit the voltage 192 with a relatively low slope from the transistor 186. The control circuit 122 also may set the capacitance to a relatively low value for the intersection 152 to transmit the voltage 192 with a relatively low slope. The different transmitted voltages cause both arriving voltages at the intersection 152 and 154 to both approximate the voltage 168 regardless of the parasitic capacitances and/or resistances of the bitline 104-3. Similar techniques may be applied to any other intersection of bitlines 104 and wordlines 106 based on an electrical distance between the respective intersection and respective drivers of the bitlines 104 and/or the wordlines 106.

Figure 6:
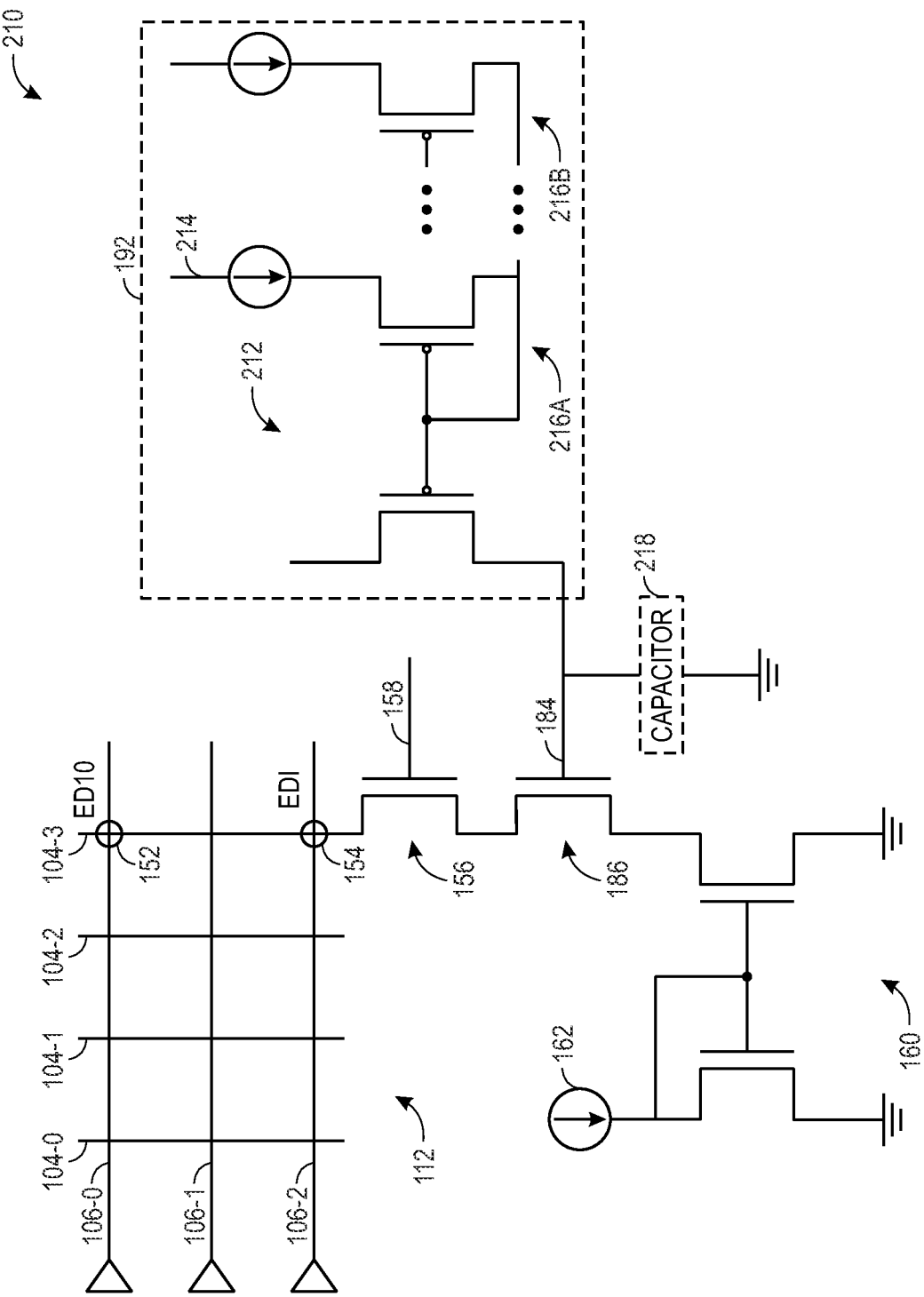
FIG. 6 is a circuit diagram of the memory device of FIG. 4 with the drive modulator implemented using a current mirror, according to an embodiment of the present disclosure.

FIG. 6 is a schematic diagram of a memory device 210 that may be an embodiment of the memory device 150 and/or 100. In the memory device 210, the drive modulator 182 is implemented using a current mirror 212. As illustrated, the current mirror 212 receives a signal 214 that is passed as the control signal 184. The control signal 184 is formed by the current mirror 212 based on the ED of the respective intersection to be accessed. Specifically, a number of legs 216 (e.g., legs 216A and 216B) may be used according to the ED of the intersection to be accessed. For instance, the leg 216A may be used when the intersection 154 is to be accessed. The leg 216B may be used when the intersection 152 is to be accessed. In some embodiments, each leg 216 may be used individually. Additionally or alternatively, some legs 216 may be used together to drive at least some of the intersections. For example, the legs 216A and 216B may be used together to drive the intersection 152. In some embodiments, the current mirror 212 may be supplemented using an optional capacitor 218 to refine the shape of the control signal 184 to be applied to the transistor 186. As previously noted, the control signal 184 causes the transistor 186 to transmit different voltages. The different transmitted voltages cause arriving voltages at different intersections (e.g., the intersections 152 and 154) to each approximate the voltage 168 regardless of the parasitic capacitances and/or resistances of the bitline 104-3. Similar techniques may be applied to any other intersection of bitlines 104 and wordlines 106 based on an electrical distance between the respective intersection and respective drivers of the bitlines 104 and/or the wordlines 106.

Figure 7:
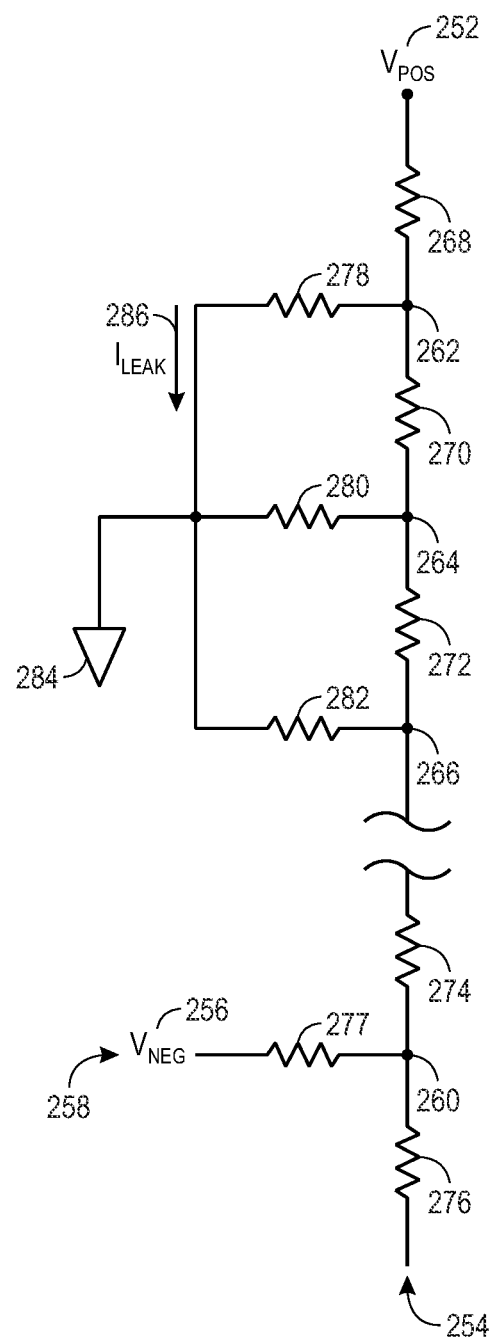
FIG. 7 is a simplified schematic diagram of driving circuitry for cells of the memory device of FIG. 1, according to an embodiment of the present disclosure.

As previously discussed, even target cells that have the same ED may receive different voltages due to subthreshold leakage due to the different distances/numbers of cells between the target cells and each of their respective drivers. For instance, FIG. 7 is a simplified circuit diagram of driving circuitry 250 for a target cell 260. As illustrated, the target cell 260 is driven from a first driver (e.g., bitline or wordline driver) using a positive voltage 252 along a respective line 254 (e.g., bitline or wordline). The target cell 260 is also driven from a second driver (e.g., bitline or wordline driver) using a negative voltage 256 along a respective line 258 (e.g., bitline or wordline). Although the target cell 260 is a first cell along the line 258, there are multiple cells between the driver driving the positive voltage 252 and the target cell 260. For instance, cells 262, 264, and 266 are between the driver of the positive voltage 252 and the target cell 260. There is also some resistance 268 between the driver and the cell 262 (with or without including resistance at the cell 262 itself). Similarly, there is resistance 270 along the line 254 between the cell 262 and the cell 264 (with or without including resistance at the cell itself 264), and there is resistance 272 along the line 254 between the cell 264 and 266 (with or without including resistance at the cell itself 266). Similarly, additional resistances 274 and 276 exist along the line 254. Furthermore, there is a resistance 277 along the line 258 between the driver of the negative voltage 277 and the cell 260.

Each of the cells 262, 264, and 266 may be inactive as they are not the target of the driven voltages. These cells 262, 264, and 266 may use one more transistors to block charge from being used at the respective cells 262, 264, and 266. However, these transistors and their connections (represented as resistors 278, 280, and 282) may be connected to a common return 284 and may transmit a leakage current 286 even when the thresholds of the transistors are not met/surpassed. In other words, the leakage current 286 may be a subthreshold leakage that leaks off charge from the line 254 causing the voltage transmitted along the line 254 to the cell 260 to be less than the positive voltage 252 supplied by the driver. The amount of charge leaked from the line 254 between the target cell 260 and the driver changes how much the voltage at the target cell 260 varies from the positive voltage 252. Since the amount of charge leaked from the line 254 between the target cell 260 and the driver depends on the number of cells/distance between the target cell 260 and the driver, the memory device 100 may track and compensate for the distance between individual drivers and the target cell 260 in addition to or alternative to the per-ED mitigation previously discussed.

Figure 8:
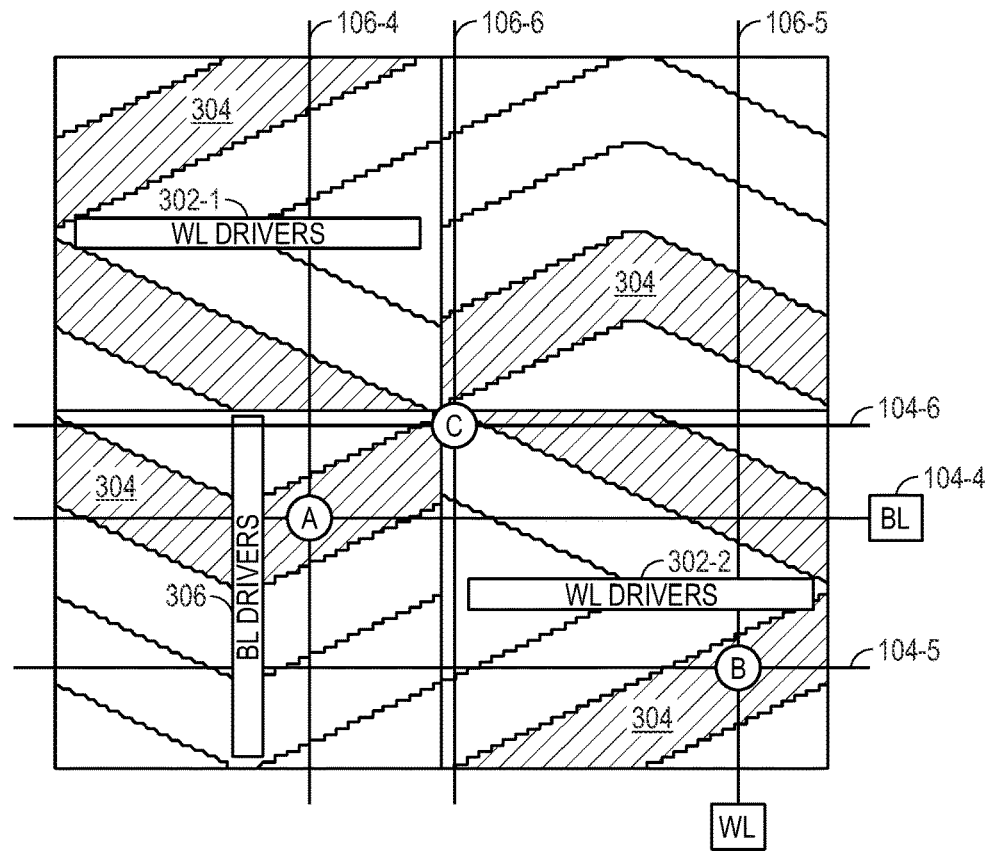
FIG. 8 is a diagram of memory cells in a grid of the memory device of FIG. 1, according to an embodiment of the present disclosure.

FIG. 8 illustrates a map 300 of ED zones. The map 300 show a wordline driver 302-1 that drives cell A along wordline 106-4 and a wordline driver 302-2 that drives cell B along wordline 106-5 and drives cell C along wordline 106-6. Cells A, B, and C are all driven by the bitline driver 306 along respective bitlines 104-4, 104-5, and 104-6. As illustrated, cells A, B, and C are all in zone 304 having an ED of 3. However, as illustrated, cell A is close (e.g., within a first threshold number of cells) to the bitline driver 306 and far (e.g., farther than a second threshold number of cells) from the wordline driver 302-1, cell B is far from the bitline driver 306 and close to the wordline driver 302-2, and cell C is neither close to nor far from the bitline driver 306 or the wordline driver 302-2.

When the driver that is close to the target cell 260 supplies the more positive voltage, the voltage supplied to the target cell 260 from the driver may remain primarily unchanged while the less positive voltage (e.g., 0V voltage) has little change. However, for the same polarity, when the target cell 260 is far from the driver, the leakage current 286 may degrade the voltage at the target cell 260 more greatly while the less positive voltage is relatively unchanged. This difference may be due to the fact that the amount of leakage in the leakage current 286 is attributable to the amount of absolute bias voltage where the higher the absolute bias voltage causes more current to leak even when the threshold voltage at the transistors are the same. In other words, for two different cells having positive voltages at the same distance, the more positive bias voltage leads to more leakage than the less positive bias voltage.

To mitigate such leakage, the memory device 100 may attempt to rebalance a total applied voltage (Vdm) across the target cell 260 by applying more (absolute) voltage to the shorter distance between the respective driver and the target cell 260. By applying less absolute voltage to the longer path, the memory device 100 may reduce/minimize voltage loss due to the leakage current 586 on the longer path.

Figure 9:
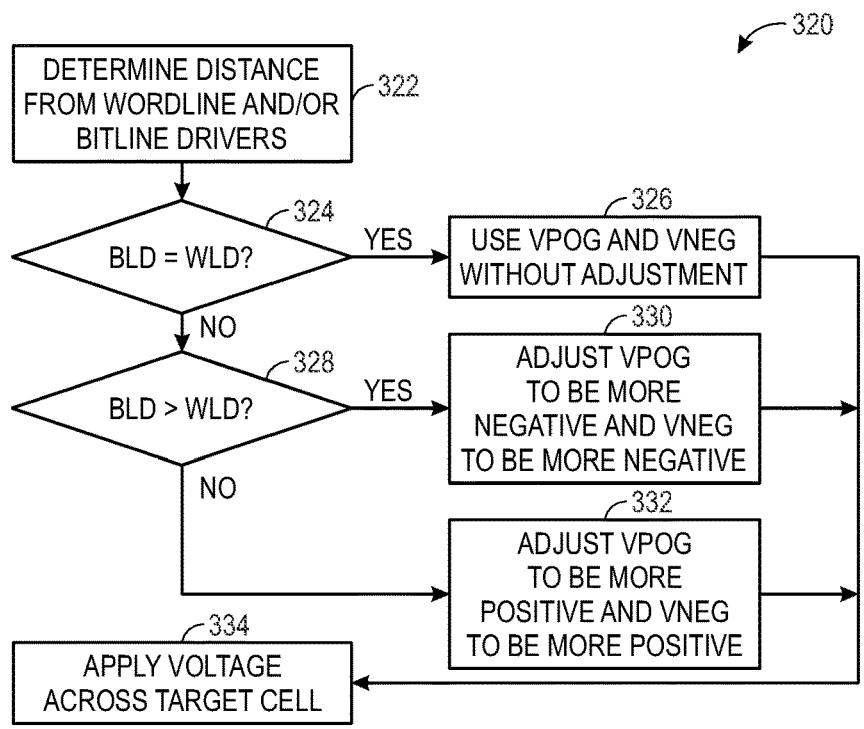
FIG. 9 is a flow diagram of a process for mitigating distance-based transistor leakage, according to an embodiment of the present disclosure.

FIG. 9 is a flow diagram of a process 320 utilizing the memory device 100. For a target cell, the memory device 100 determines a wordline distance (WLD) from the wordline driver to the target cell 260 and/or a bitline distance (BLD) from the bitline driver to the target cell 260 (block 322). In other words, the distance includes a distance from a single driver. The distance may be expressed in a number of cells between the driver and the target cell. The WLD and/or the BLD may be determined by using a lookup table. For instance, the lookup table may be indexed by address used to determine the WLD and the BLD. The WLD and the BLD determinations may be made in addition to the ED used in the previous voltage adjustments. The target cell 260 may be the target of a read operation, a selection operation, and/or any other operation that accesses the target cell. The memory device 100 may determine whether the BLD is the same as the WLD (block 324). If the BLD is the same as the WLD, the memory device 100 uses the positive voltage 252 and the negative voltage 256 without adjustment for the current leakage 286 (block 326). In other words, the memory device 100 may determine whether one of the lines coupled to the target cell 260 is more susceptible to leakage (e.g., subthreshold leakage).

If the BLD is not the same as the WLD, the memory device 100 may determine whether the BLD is greater than the WLD (block 328). For the current embodiment, the bitline may be used to supply the more positive voltage to the target cell 260. However, in other embodiments, the wordline may be used to supply the more positive voltage to the target cell 260. Since the bitline driver in the current embodiment is used to supply the more negative voltage, when the BLD is greater than that the WLD, the memory device 100 may shift the positive voltage 252 and the negative voltage 256 more negative (or less positive) (block 330). For instance, if the positive voltage 252 were originally 3.0V, and the negative voltage 256 were originally −3.0V, the memory device 100 may adjust the positive voltage 252 to 2.9V and the negative voltage 256 to −3.1V.

If the BLD is not greater than the WLD, the memory device 100 may adjust both the positive voltage 252 more positive (or less negative) and adjust the negative voltage 256 to be more positive (or less negative) (block 332). For instance, if the positive voltage 252 were originally 3.0V, and the negative voltage 256 were originally −3.0V, the memory device 100 may adjust the positive voltage 252 to 3.1V and the negative voltage 256 to −2.9V.

In other words, the memory device 100 may determine which line is more susceptible to voltage variation due to leakage. The memory device 100 may then apply an adjustment to both lines (e.g., bitline 104 and the wordline 106) of the target cell 260. The direction of the adjustment corresponds to the polarity of the closer driver. In other words, the compensation circuitry reduces an absolute value of the voltage used to drive the line (e.g., bitline 104 or wordline 106) having the farther distance. For instance, if the driver corresponding to the more negative voltage is further away and more susceptible to leakage than the more positive voltage, the memory device shifts both the more negative voltage and the more positive voltage in a more positive/less negative direction.

Furthermore, in some embodiments, the amount of adjustment to the shift of the positive voltage 252 and the negative voltage 256 may be proportional to an offset voltage. For instance, the ratio of BLD to WLD (e.g., BLD/WLD) may be multiplied by the offset voltage. In other words, the amount of offset applied depends upon how imbalanced the distances are from its respective drivers. The more imbalanced the distances; the more offset is applied. The offset voltage may be determined empirically and/or may be user programmed.

Once the adjustment is made or is determined to not occur, the memory device 100 applies the Vdm across the target cell 260 using the adjusted/non-adjusted positive and negative voltages (block 334). By shifting the positive voltage 252 and the negative voltage 256 by the same direction and amount, the memory device may adjust the bias voltage while maintaining a constant Vdm.

Figure 10:
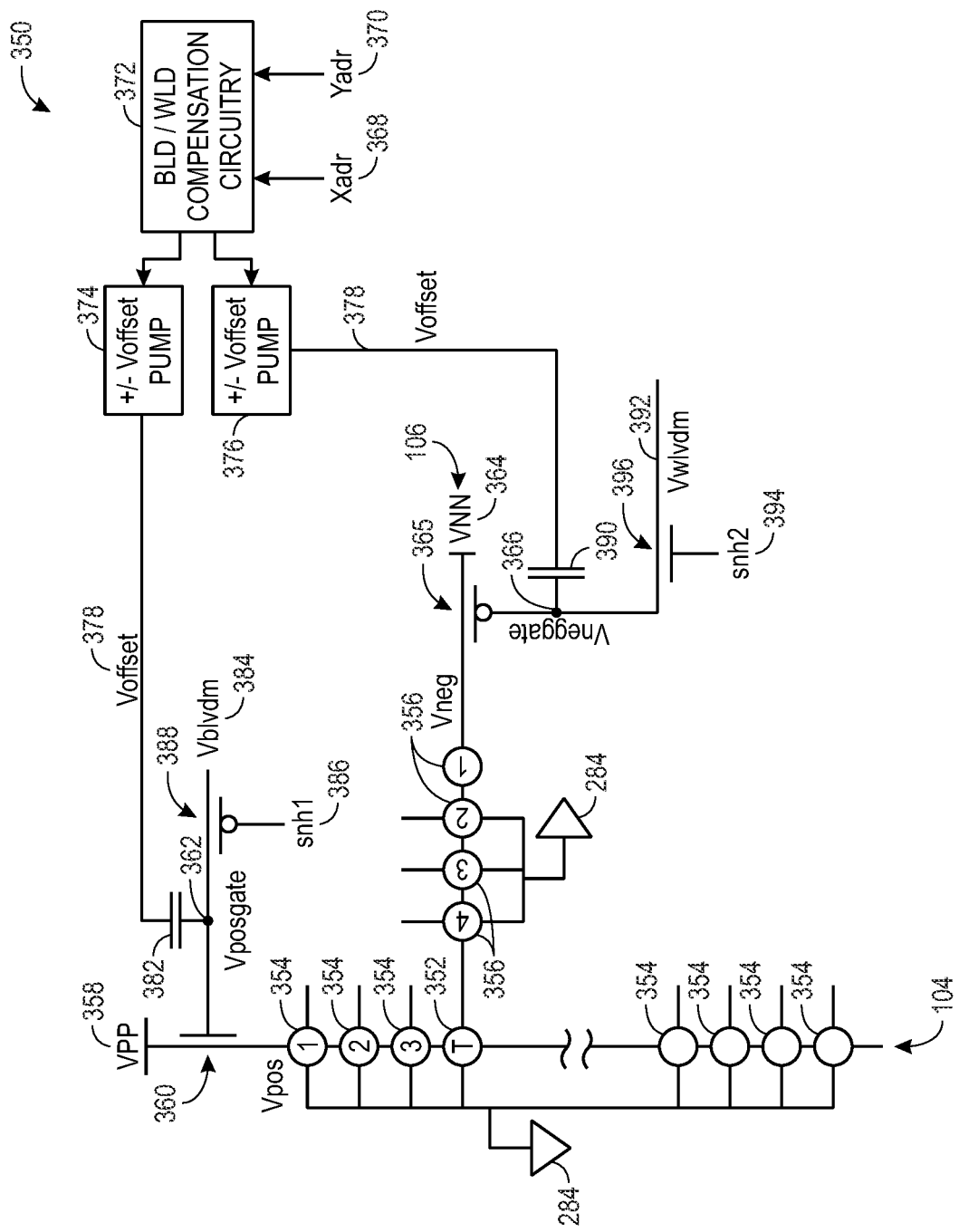
FIG. 10 is a circuit diagram of circuitry that may be used to implement the process of FIG. 9, according to an embodiment of the present disclosure.

FIG. 10 is a schematic diagram of adjustment circuitry 350 used to adjust voltages along bitlines 104 and wordlines 106 for a target cell 352. As illustrated, the bitline 104 has cells 354 along the bitline 104, and the wordline 106 has cells 356 along the wordline 106. The adjustment circuitry 350 receives a voltage VPP 358 at a transistor 360. The transistor 360 receives a Vposgate voltage 362 at the gate of the transistor. The transistor 360 uses a level of the Vposgate voltage 362 to set the level of voltage Vpos transmitted to the bitline 104. Due to leakage at the cells 354, the bitline 104 may supply a different voltage than Vpos at the target cell 352.

The adjustment circuitry 350 receives a voltage VNN 364 at a transistor 365. The transistor 365 receives a Vneggate voltage 366 at the gate of the transistor 365. The transistor 365 uses a level of the Vneggate voltage 366 to set the level of voltage Vneg transmitted to the wordline 106. Due to leakage at the cells 356, the wordline 106 may supply a different voltage than Vneg at the target cell 352.

To mitigate the leakage at the cells 354 and 356, the memory device 100 may compensate supplied voltages Vpos and/or Vneg based on the address of the target cell 352. For instance, the target cell 352 may correspond to an Xaddress 368 and a Yaddress 370. The Xaddress 368 may correspond to an address in a first direction (along the bitline 104 or along the wordline 106). The Yaddress 370 may correspond to an address in a second direction (along the bitline 104 or along the wordline 106). BLD/WLD compensation circuitry 372 may receive the Xaddress 368 and the Yaddress 370 and output compensation values to one or more offset pumps 374 and/or 376. The one or more offset pumps 374 and/or 376 may include charge pumps that utilize the compensation values to control the amount of offset (Voffset 378) used for compensation of the drive voltages. The BLD/WLD compensation circuitry 372 may be included in the control circuit 122 and/or the decoders 108. The BLD/WLD compensation circuitry 372 may convert the addresses to a corresponding compensation amount. For instance, the BLD/WLD compensation circuitry 372 may determine a ratio of BLD to WLD and use this ratio to drive the corresponding offset pumps 374 and/or 376 to appropriate levels. In some embodiments, a single charge pump may be used since the same amount of offset (Voffset 378) may be applied to both the bitline 104 and the wordline 106.

The Voffset 378 is applied to a capacitor 382. The capacitor 382 is charged using a Vblvdm voltage 384 using a first sample and hold (snh1) signal 386 via a transistor 388. The transistor 388 may be a PMOS transistor. The snh1 signal 386 may be used to precharge the Vposgate 362. Similarly, the Voffset 378 is applied to a capacitor 390. The capacitor 390 is charged using a Vwlvdm voltage 392 using a second sample and hold (snh2) signal 394 via a transistor 396. The transistor 396 may be an NMOS transistor. Using the Voffset 378 to adjust the Vposgate 362 and the Vneggate 366, the adjustment circuitry 350 may adjust the amount of charge applied to the bitline 104 as Vpos and applied to the wordline 106 as Vneg. By applying these offsets using the techniques previously discussed, the memory device 100 may apply a consistent Vdm across various target cells regardless of the distance between the imbalance in WLD and BLD for each respective target cell.

Technical effects of certain embodiments of the present disclosure include systems and methods that enable memory cells located at near and far intersections to be driven similarly using waveshaping to compensate for the differences in transmission line resistance and/or capacitance. By driving the memory cells located at the near and far intersections, the memory device may perform more consistently and may reduce wear for the memory cells located at the near intersections. For instance, the waveforms of the signals transmitted to the near intersections may emulate the signals received at the far intersections. In addition to waveshaping, the memory device may apply offsets to voltages based on WLD and BLD. By applying these offsets using the techniques previously discussed, the memory device may apply a consistent Vdm across various target cells regardless of the distance between the imbalance in WLD and BLD for each respective target cell.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
a plurality of wordlines;
a plurality of bitlines, wherein the plurality of wordlines and the plurality of bitlines form a grid;
a plurality of memory cells located at intersections of the plurality of bitlines and the plurality of wordlines in the grid;
a plurality of bitline drivers;
a plurality of wordline drivers; and
compensation circuitry configured to:
   determine a bitline distance of a first bitline driver of the plurality of bitline drivers from a first memory cell of the plurality of memory cells, a wordline distance of a first wordline driver of the plurality of wordline drivers from the first memory cell, or both the wordline distance and the bitline distance; and
   output values to control one or more voltages applied to the first memory cell based at least in part on the bitline distance, the wordline distance, or both.

2. The memory device of claim 1, wherein at least one of the one or more voltages is applied via a first bitline corresponding to the first bitline driver of the first memory cell.

3. The memory device of claim 1, wherein at least one of the one or more voltages is applied via a first wordline corresponding to the first wordline driver of the first memory cell.

4. The memory device of claim 1, wherein the values cause the one or more voltages to be unchanged if the wordline distance is equal to the bitline distance for the first memory cell.

5. The memory device of claim 1, wherein one or more voltages comprise a positive voltage and a negative voltage that are both applied to the first memory cell, and the values cause both to be adjusted if the bitline distance and the wordline distance are different than each other.

6. The memory device of claim 5, wherein when the bitline distance is greater than the wordline distance, the values cause the positive voltage and the negative voltage to both be more negative.

7. The memory device of claim 5, wherein when the bitline distance is less than the wordline distance, the values cause the positive voltage and the negative voltage to both be more positive.

8. The memory device of claim 1, wherein the compensation circuitry is configured to cause the one or more voltages to be applied to the first memory cell and an additional one or more voltages to be applied to a second memory cell of the plurality of memory cells via a second bitline of the plurality of bitlines, via a second wordline of the plurality of wordlines, or via both the second bitline and the second wordline.

9. The memory device of claim 8, wherein the first memory cell and the second memory cell correspond to a same electrical distance from respective bitline drivers and respective wordline drivers, and the one or more voltages are different than the additional one or more voltages.

10. The memory device of claim 8, wherein the first memory cell and the second memory cell correspond to different electrical distances from respective bitline drivers and respective wordline drivers, and the one or more voltages are different than the additional one or more voltages.

11. The memory device of claim 1, comprising a charge pump configured to output an offset voltage based on the values from the compensation circuitry.

12. The memory device of claim 11, comprising a transistor configured to adjust the one or more voltages based on the offset voltage applied via a first bitline corresponding to the first bitline driver of the first memory cell, applied via a first wordline corresponding to the first wordline driver of the first memory cell, or applied via both the first bitline and the first wordline.

13. The memory device of claim 12, comprising a capacitor coupled between the charge pump and the transistor.

14. A method, comprising:
determining, using compensation circuitry of a memory device, a first distance, along a wordline, from a wordline driver to a target memory cell of a plurality of memory cells of the memory device;
determining, using the compensation circuitry, a second distance, along a bitline, from a bitline driver to the target memory cell, wherein the plurality of memory cells are distributed in a memory array at a plurality of intersections, wherein the target memory cell is indicated as to-be-accessed and is located at an intersection of the wordline and the bitline;
when the first distance is greater than the second distance, adjusting, using the compensation circuitry, a voltage of the wordline driver, a voltage of the bitline driver, or both in a first direction;

when the second distance is greater than the first distance, adjusting, using the compensation circuitry, the voltage of the wordline driver, the voltage of the bitline driver, or both in a second direction; and driving the target memory cell using the voltage of the wordline driver and the voltage of the bitline driver.

15. The method of claim 14, wherein the first distance is based on a number of memory cells along the wordline between the target memory cell and the wordline driver.

16. The method of claim 14, wherein the second distance is based on a number of memory cells along the bitline between the target memory cell and the bitline driver.

17. The method of claim 14, wherein the target memory cell is a target of a read operation or a selection operation.

18. The method of claim 14, comprising, when the first distance is equal to the second distance, performing no adjustment to the voltage of the wordline driver and the voltage of the bitline driver before driving the target memory cell using the voltage of the wordline driver and the voltage of the bitline driver.

19. A memory device, comprising:
a plurality of bitlines arranged in parallel to each other;
a plurality of wordlines arranged parallel to each other and perpendicular to the plurality of bitlines;
a plurality of memory cells located at intersections of the plurality of bitlines and the plurality of wordlines;
a plurality of bitline drivers, each configured to transmit a first voltage to a respective memory cell of the plurality of memory cells along respective bitlines;
a plurality of wordline drivers, each configured to transmit a second voltage to a respective memory cell of the plurality of memory cells along respective wordlines; and
compensation circuitry configured to:
determine a distance between a target memory cell and its corresponding bitline driver of the plurality of bitline drivers;
adjust a bias of the first voltage of the corresponding bitline driver based at least in part on the distance; and
drive the target memory cell using the adjusted bias first voltage.

20. The memory device of claim 19, wherein the compensation circuitry is configured to determine a second distance between the target memory cell and its corresponding wordline driver of the plurality of wordline drivers, and wherein the compensation circuitry is configured to adjust the bias of the first voltage of the corresponding bitline driver in a direction based on a ratio between the distance and the second distance.

21. The memory device of claim 20, wherein adjusting the bias of the first voltage comprises adjusting the bias of the first voltage in a less positive/more negative direction when the distance is greater than the second distance.

22. The memory device of claim 20, wherein adjusting the bias of the first voltage comprises adjusting the voltage in a more positive/less negative direction when the second distance is greater than the distance.

23. A memory device, comprising:
a plurality of bitlines arranged in parallel to each other;
a plurality of wordlines arranged parallel to each other and perpendicular to the plurality of bitlines;
a plurality of memory cells located at intersections of the plurality of bitlines and the plurality of wordlines;
a plurality of bitline drivers, each configured to transmit a first voltage to a respective memory cell of the plurality of memory cells along respective bitlines;
a plurality of wordline drivers, each configured to transmit a second voltage to a respective memory cell of the plurality of memory cells along respective wordlines; and
compensation circuitry configured to:
determine a distance between a target memory cell and its corresponding wordline driver of the plurality of wordline drivers;
adjust a bias of the second voltage of the corresponding wordline driver based at least in part on the distance; and
drive the target memory cell using the adjusted bias second voltage.

24. The memory device of claim 23, wherein the compensation circuitry is configured to determine a second distance between the target memory cell and its corresponding bitline driver of the plurality of bitline drivers, and wherein the compensation circuitry is configured to adjust the bias of the second voltage of the corresponding wordline driver in a direction based on a ratio between the distance and the second distance.

25. The memory device of claim 24, wherein adjusting the bias of the second voltage comprises adjusting the bias of the second voltage in a less positive/more negative direction when the distance is greater than the second distance.

26. The memory device of claim 24, wherein adjusting the bias of the second voltage comprises adjusting the voltage in a more positive/less negative direction when the second distance is greater than the distance.

* * * * *